United States Patent
Yui

(10) Patent No.: US 10,197,598 B2
(45) Date of Patent: Feb. 5, 2019

(54) PROBE

(71) Applicant: MURATA MANUFACTURING CO., LTD., Kyoto-fu (JP)

(72) Inventor: Takayoshi Yui, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/496,499

(22) Filed: Apr. 25, 2017

(65) Prior Publication Data

US 2017/0227579 A1     Aug. 10, 2017

Related U.S. Application Data

(63) Continuation of application No. PCT/JP2015/078268, filed on Oct. 6, 2015.

(30) Foreign Application Priority Data

Nov. 7, 2014 (JP) ................. 2014-226908

(51) Int. Cl.
*G01R 1/04* (2006.01)
*G01R 1/067* (2006.01)
*G01R 31/28* (2006.01)

(52) U.S. Cl.
CPC ........... *G01R 1/067* (2013.01); *G01R 1/0408* (2013.01); *G01R 31/2808* (2013.01); *G01R 31/2822* (2013.01); *G01R 1/06772* (2013.01)

(58) Field of Classification Search
CPC .................... G01R 1/067; G01R 31/2822
USPC .............. 324/755.01, 755.02, 755.05
See application file for complete search history.

(56) References Cited

U.S. PATENT DOCUMENTS

2007/0045535 A1*  3/2007  Chen .................. 250/309
2015/0268273 A1*  9/2015  Pragada ........... G01N 27/041
                                                324/754.04

FOREIGN PATENT DOCUMENTS

| JP | S61-003473 U | 1/1986 |
| JP | S61-107166 U | 7/1986 |
| JP | 2005-050720 A | 2/2005 |
| JP | 2012-099246 A | 5/2012 |

OTHER PUBLICATIONS

Office Action; "Notice of Reasons for Rejection," issued by the Japanese Patent Office dated Dec. 5, 2017, which corresponds to Japanese Patent Application No. 2016-557501 and is related to U.S. Appl. No. 15/496,499.

(Continued)

*Primary Examiner* — Farhana A Hoque
(74) *Attorney, Agent, or Firm* — Studebaker & Brackett PC

(57) ABSTRACT

A probe that enables a circuit board for electronic components, which is a measurement subject, to be disposed more densely. The probe is capable of simultaneously measuring a plurality of locations. The probe includes a plurality of main body portions having central conductors that make contact with connectors, and a first member that binds the plurality of main body portions together. A recess portion, having a base surface from which tip ends of the plurality of central conductors project, is provided in the first member. The recess portion has a sloped surface that flares outward from a base portion of the recess portion toward an opening in the recess portion.

5 Claims, 5 Drawing Sheets

(56) References Cited

OTHER PUBLICATIONS

International Search Report issued in PCT/JP2015/078268; dated Dec. 28, 2015.
Written Opinion issued in PCT/JP2015/078268; dated Dec. 28, 2015.
International Preliminary Report on Patentability issued in PCT/JP2015/078268; dated May 9, 2017.

* cited by examiner

PROBE

CROSS REFERENCE TO RELATED APPLICATIONS

This application claims benefit of priority to Japanese Patent Application 2014-226908 filed Nov. 7, 2014, and to International Patent Application No. PCT/JP2015/078268 filed Oct. 6, 2015, the entire content of which is incorporated herein by reference.

TECHNICAL FIELD

The present disclosure relates to a probe used to measure an electronic component.

BACKGROUND

Communication terminals that handle a plurality of frequencies continue to become more mainstream. This type of communication terminal has a plurality of RF circuits, each of which is connected to an antenna module. Each RF circuit has a connector for connecting to the corresponding antenna module. To check the operations of the RF circuits in the communication terminal, the plurality of RF circuits are operated simultaneously and probes are pressed against corresponding connectors at that time. The probe disclosed in Japanese Unexamined Patent Application Publication No. 2012-99246 (called a "conventional probe" hereinafter) is known as an example of a probe used to check the operations of an RF circuit and so on.

As described above, current communication terminals have a plurality of RF circuits, and thus have an equivalent number of connectors for connecting to antenna modules. Increased miniaturization and increased densities in communication terminals have resulted in the connectors being disposed close to each other on the board. If the conventional probe is used when checking the operations of the RF circuits, the proximity of the connectors to each other will cause the probes to come into contact with each other, resulting in a situation in which the operations of the RF circuits cannot be checked in a satisfactory manner. It has thus been necessary to increase the distance between connectors on the board to avoid such a situation. In other words, using the conventional probe to examine a circuit board has interfered with the ability to make the circuit board smaller and having an increased density.

SUMMARY

Technical Problem

It is an object of the present disclosure to provide a probe that enables a circuit board for electronic components, which is a measurement subject, to be disposed more densely.

Solution to Problem

A probe according to an aspect of the present disclosure is a probe capable of simultaneously measuring a plurality of locations. The probe includes a plurality of main body portions having central conductors capable of simultaneous contact with measurement subjects, and a first member that binds the plurality of main body portions together. A recess portion, having a base surface from which tip ends of the plurality of central conductors project, is provided in the first member. The recess portion has a sloped surface that flares outward from a base portion of the recess portion toward an opening in the recess portion.

With the probe according to this aspect of the present disclosure, the plurality of main body portions including the plurality of central conductors that make contact with the measurement subjects are bound together by a single member. Thus a situation in which probes make contact with each other can be avoided when measuring connectors or the like disposed near each other on a board. This makes it possible to increase the density of connectors and the like on the circuit board. Additionally, with the probe according to this aspect of the present disclosure, the recess portion, having a base surface from which tip ends of the plurality of central conductors project, is provided in the first member, and the recess portion has a sloped surface that flares outward from the base portion toward the opening. Thus when the probe according to this aspect of the present disclosure is pressed against a measurement subject, the measurement subject slides along the sloped surface and makes contact with the central conductor. In other words, with the probe according to this aspect of the present disclosure, the sloped surface in the recess portion makes it possible for the measurement subject and the central conductor to make contact in a smooth manner. Thus with the probe according to this aspect of the present disclosure, electrical signals emitted from the measurement subjects can be accurately measured.

Advantageous Effects of Disclosure

According to the present disclosure, electronic components serving as measurement subjects can be disposed on a circuit board at a high density.

DETAILED DESCRIPTION

A probe 1 embodying the disclosure will be described with reference to the drawings. In the following, a direction oriented toward a cable from a tip end of the probe 1 is defined as a z-axis direction. A direction in which central conductors of the probe 1 are arranged is defined as an x-axis direction. Furthermore, a direction orthogonal to the x-axis and z-axis is defined as a y-axis direction. Note that the x-axis, the y-axis, and the z-axis are orthogonal to one another. Additionally, surfaces on the positive side of the z-axis direction will be called upper surfaces, and surfaces on the negative side of the z-axis direction will be called lower surfaces. Surfaces parallel to the z-axis direction will be called side surfaces.

Figure 1:
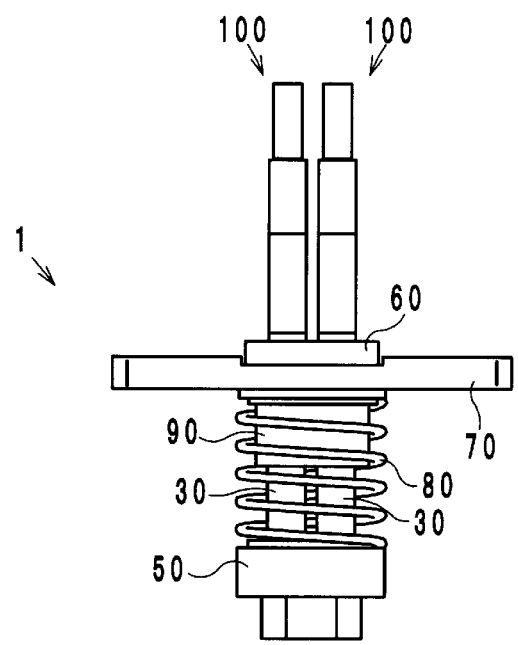
FIG. 1 is an external view of a probe according to an embodiment.

(Overall Configuration of Probe—FIG. 1)

The probe 1 is a probe capable of simultaneously measuring electrical signals emitted from two terminals provided on a circuit board. Thus two coaxial cables 100 for transmitting two received signals are connected to the probe 1, as illustrated in FIG. 1. The probe 1 further includes: two main body portions 30, each containing a central conductor 20 that contacts a terminal provided on the circuit board; a first member 50 that binds together one end side of each of the main body portions 30; a second member 60 that binds together another end side of each of the main body portions 30; a flange 70 for anchoring the main body portions 30 to circuit board inspection equipment; a spring 80 located between the first member 50 and the flange 70; and a bushing 90 located between the spring 80 and the flange 70.

Figure 2:
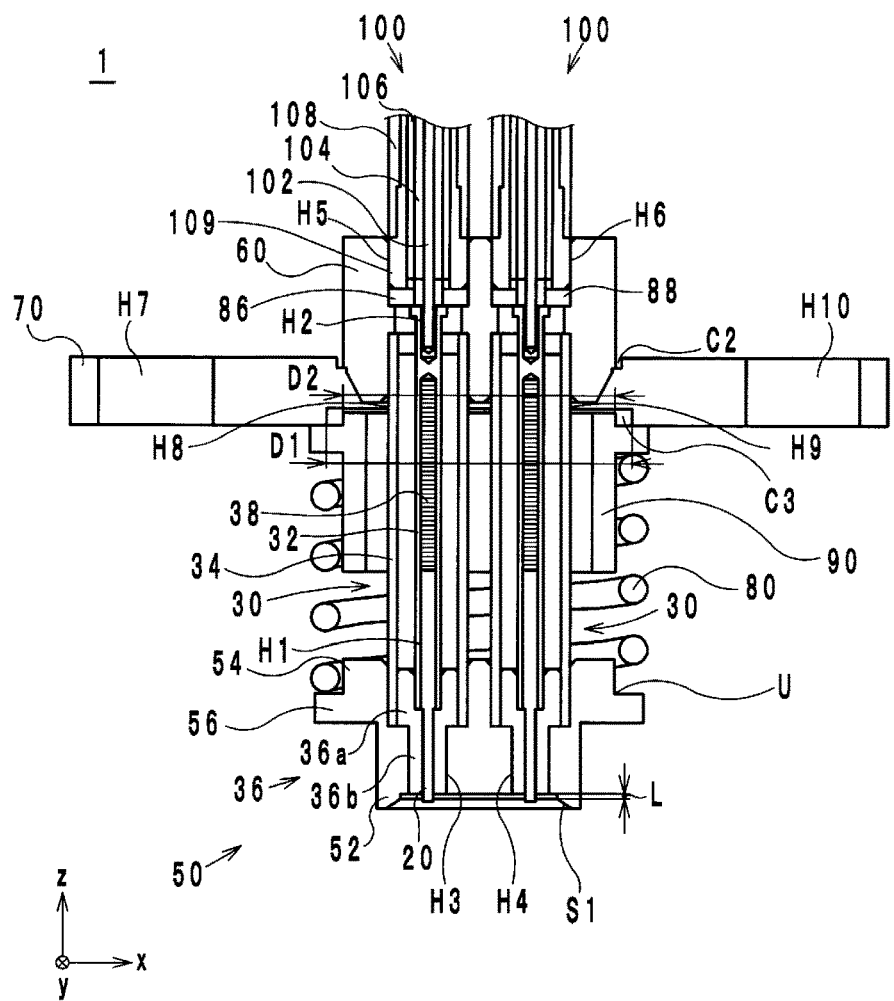
FIG. 2 is a cross-sectional view of a probe according to an embodiment.
Figure 3:
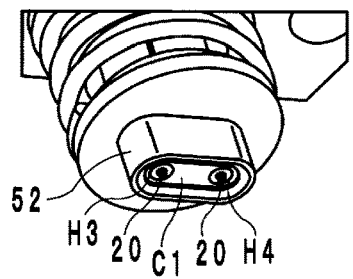
FIG. 3 is an external view of a recess portion of a probe according to an embodiment.

(Description of Elements of Probe—FIGS. 2 and 3)

As illustrated in FIG. 2, each main body portion 30 is constituted of the central conductor 20, an inner conductor 32, an outer cylinder 34, a bushing 36, and a spring 38.

The central conductor 20 is a rod-shaped member formed from Cu. As illustrated in FIG. 2, only an end portion of the central conductor 20 on the negative side in the z-axis direction is exposed from the first member 50, which will be described later. Furthermore, a step is provided near the center of the central conductor 20 with respect to the z-axis direction. This step catches on the bushing 36, which is one of the members constituting the main body portion 30, to prevent the central conductor 20 from pulling out from the main body portion 30.

The inner conductor 32 is a circular column-shaped conductor extending in the z-axis direction. Cylindrical depressions H1 and H2 having base portions are hollowed out from both the positive and negative sides of the inner conductor 32 in the z-axis direction. The depressions H1 and H2 do not communicate with each other. The central conductor 20 and the spring 38 are located in the depression H1 on the negative side in the z-axis direction, in that order from the negative side. The spring 38, which is contained in the depression H1 such that the central conductor 20 produces a restorative force using the spring 38, is provided such that one end thereof makes contact with the base portion of the depression H1 and another end thereof makes contact with the central conductor 20. A core wire of the coaxial cable 100, which will be described later, is pulled into the depression H2 on the positive side in the z-axis direction. Additionally, a side surface on an outer peripheral side of the inner conductor 32, on the negative side in the z-axis direction, makes contact with the bushing 36. The inner conductor 32 is supported by the outer cylinder 34 with the bushing 36 interposed therebetween.

The outer cylinder 34 is a cylindrical member extending in the z-axis direction, and covers the periphery of the inner conductor 32. As described above, the outer cylinder 34 supports the inner conductor 32 with the bushing 36 interposed therebetween. Furthermore, ends of the outer cylinder 34 are anchored to the first member 50 and the second member 60, respectively.

The bushing 36 is a resin formed from polyacetal (POM), polytetrafluoroethylene (PTFE), or the like. In the present embodiment, polyacetal (POM) is used as the material of the bushing 36. The dielectric constant of this resin is preferably lower than that of the inner conductor 32. Assuming, for example, that the impedance of the probe is set to 50Ω, using a material having a lower dielectric constant suppresses the occurrence of stray capacitance between the inner conductor 32 and the outer cylinder 34, even if the bushing 36 is reduced in size and the distance between the inner conductor 32 and the outer cylinder is shortened as a result. This makes it easier to set the impedance of the probe to 50Ω. The bushing 36 has a shape in which two cylinders 36a and 36b having different diameters are arranged adjacent to each other such that center axes thereof match. Here, the cylinder 36a, which has the larger diameter, is located on the positive side of the cylinder 36b, which has the smaller diameter, in the z-axis direction, and is fitted into an end portion of the outer cylinder 34 on the negative side in the z-axis direction. Meanwhile, the inner conductor 32 is inserted into an inner circumferential side of the cylinder 36a along with the central conductor 20. The cylinder 36b, which has the smaller diameter, is fitted into a through-hole provided in the first member 50, which will be described later. The central conductor 20 projects from the inner circumferential side of the cylinder 36b toward the negative side in the z-axis direction. An inner diameter of the cylinder 36b is smaller than an inner diameter of the cylinder 36a. As such, a step is formed in the inner circumferential side of the bushing 36. The step in the bushing 36 catches on the step in the central conductor 20 so as to prevent the central conductor 20 from being ejected from the main body portion 30.

The spring 38 is a coil-shaped spring, and is located within the inner conductor 32 as described above. The spring 38 is normally in a compressed state so as to push the central conductor 20 toward the negative side in the z-axis direction. When the probe 1 makes contact with a terminal to be measured, the spring 38 compresses further so as to soften an impact occurring when the central conductor 20 makes contact with the terminal.

The first member 50 is a member formed from Cu, located at an end portion of the probe 1 on the negative side in the z-axis direction. The first member 50 has a shape obtained by placing two disks 54 and 56 having different diameters on an upper surface of a column-shaped tip end portion 52 having an elliptical cross-section. Two through-holes H3 and H4 are provided in the first member 50 so as to pass through the first member 50 in the z-axis direction. The two main body portions 30 are anchored to and bound together by the first member 50 by fitting the two main body portions 30 into the through-holes H3 and H4. The through-holes H3 and H4 have different diameters on the side where the tip end portion 52 is located and the side where the disks 54 and 56 are located, with the diameters being greater on the side where the disks 54 and 56 are located than on the side where the tip end portion 52 is located. Thus only the bushings 36 and the central conductors 20 of the main body portions 30 reach the tip end portion 52 sides of the through-holes H3 and H4.

As illustrated in FIG. 3, a recess portion C1 is provided in a lower surface of the tip end portion 52. Viewed from the z-axis direction, the recess portion C1 is an ellipse analogous to the cross-section of the tip end portion 52, and is provided such that the ellipse surrounds the through-holes H3 and H4 that pass through the first member 50. Accordingly, the central conductors 20 of the main body portions 30 fitted into the through-holes H3 and H4 project from the recess portion C1. Furthermore, a sloped surface S1 is provided in the recess portion C1, such that the recess portion C1 flares outward from the base portion of the recess portion C1 toward the opening in the recess portion C1, or in other words, from the positive side in the z-axis direction toward the negative side in the z-axis direction, as illustrated in FIG. 2. Note that the sloped surface S1 is provided in a location distanced from the base portion of the recess portion C1 by a predetermined distance L in the z-axis direction. The predetermined distance L may be 0, or in other words, the sloped surface S1 may be provided directly in the base portion of the recess portion C1.

The disks 54 and 56 are arranged in that order from the positive side toward the negative side in the z-axis direction, with center axes thereof matching. The diameter of the disk 54 is smaller than the diameter of the disk 56, and thus a step is formed by a groove U in an outer circumferential side near the area where the disk 54 and the disk 56 make contact.

The second member 60 is a member formed from Cu, located at an end portion of the probe 1 on the positive side in the z-axis direction. The second member 60 is shaped as a column extending in the z-axis direction, with an elliptical cross-section. A corner formed by the side surface and the lower surface of the second member 60 is tapered. Furthermore, two through-holes H5 and H6 are provided in the second member 60 so as to pass through the second member 60 in the z-axis direction. The two main body portions 30 are fitted into the through-holes H5 and H6 from the negative side in the z-axis direction. Furthermore, the two coaxial cables 100 are inserted into the through-holes H5 and H6 from the positive side in the z-axis direction. Core wires 102 of the coaxial cables 100 are connected to corresponding inner conductors 32 of the main body portions 30 as a result. Lower surfaces of the coaxial cables 100 (described later), aside from the core wires 102 and insulation films 104, make contact with cylindrical bushings 86 and 88 provided within the through-hole H5 and the through-hole H6, respectively.

The flange 70 is a component for attaching the probe 1 to an inspection device for inspecting a circuit board. The flange 70 is an elliptical flat plate. Furthermore, through-holes H7 to H10 are provided in the flange 70, in that order from the negative side to the positive side in the x-axis direction. The through-holes H8 and H9 are through-holes through which the outer cylinders 34 of the two main body portions 30 pass, and the through-holes H7 and H10 are through-holes for attaching the probe to the inspection device. The diameters of the through-holes H8 and H9 are slightly larger than the diameters of the outer cylinders 34. There is thus a small gap at the areas where the main body portions 30 make contact with the flange 70. The main body portions 30 are thus not completely anchored to the flange 70, and can move up and down relative to the flange 70 as well as tilt relative to the flange 70. The shape of the flange 70 need not be an ellipse, and may be a rectangle or a combination of a rectangle and circular arcs. Furthermore, the second member 60 and the main body portions 30 may be formed as integrated members.

Recess portions C2 and C3 are furthermore provided in the upper surface and the lower surface of the flange 70 so as to surround the through-holes H8 and H9. Part of the second member 60 on the negative side in the z-axis direction fits within the recess portion C2 provided in the upper surface. A corner formed by the side surface of the recess portion C2 and the upper surface of the flange 70 is tapered. Thus when the second member 60 fits within the recess portion C2, the tapered part of the second member 60 makes close contact with the tapered part of the recess portion C2 in the flange 70. An end portion of the bushing 90 (described later) on the positive side in the z-axis direction fits within the recess portion C3 provided in the lower surface of the flange 70. A diameter D1 of the recess portion C3 is greater than a diameter D2 of the end portion of the bushing 90 on the positive side in the z-axis direction. The bushing 90 can therefore move along the lower surface of the flange 70. As a result, the probe 1 can move along an x-y plane when the probe 1 is pressed against connectors 300 (described later). This makes it possible to correct positional skew between the central conductors 20 of the probe 1 and contact parts 304 of the connectors 300 (described later) in the x-y plane, which ensures good contact between the central conductors 20 and the contact parts 304.

The spring 80 is a coil-shaped spring extending in the z-axis direction, and the two main body portions 30 are contained on an inner circumferential side thereof. One end of the spring 80, on the negative side in the z-axis direction, is fitted onto the groove U in the first member 50. Another end of the spring 80, on the positive side in the z-axis direction, is fitted onto the bushing 90 (described later). The spring 80 applies a force on the first member 50 toward the negative side in the z-axis direction. Note that the spring 80 and the main body portions 30 are not in contact, and are instead distanced from each other by a predetermined distance M.

The bushing 90 is a cylindrical polyacetal (POM) resin member extending in the z-axis direction. The outer cylinders 34 of the two main body portions 30 are located on an inner circumferential side of the bushing 90. The length of the bushing 90 in the z-axis direction is half the length of the outer cylinders 34 in the z-axis direction. Additionally, part of the bushing 90 fits within the recess portion C3 in the flange 70. The bushing 90 therefore covers the periphery of the outer cylinders 34 on the positive side in the z-axis direction. Furthermore, part of the bushing 90 projects outward in a direction orthogonal to the z-axis. A step is thus formed in the side surface of the bushing 90, and the other end of the spring 80, on the positive side in the z-axis direction, is fitted onto this step. In addition to polyacetal (POM), a resin member having superior sliding properties such as PEEK can also be used as the material of the bushing 90.

(Overview of Cables Connected to Probe—FIG. 2)

As illustrated in FIG. 2, the probe 1 is connected to tip ends of the two coaxial cables 100. Each coaxial cable 100 includes the core wire 102, insulation films 104 and 108, and an outer conductor 106. The core wire 102 is a conducting wire that transmits a high-frequency signal, which is supplied from a measurement subject through the probe 1. The outer conductor 106 surrounds the periphery of the core wire 102, and a ground potential is applied thereto. The insulation film 104 is provided in the periphery of the core wire 102 so as to insulate the core wire 102 from the outer conductor 106. The insulation film 108 is provided in the periphery of the outer conductor 106, and forms a surface of the coaxial cable 100. A coaxial connector socket 109 is provided on the tip end of each coaxial cable 100. The coaxial cables 100 are connected to the probe 1 by the sockets 109. The coaxial cables 100 are connected to a measurement device, which is not illustrated.

Figure 4:
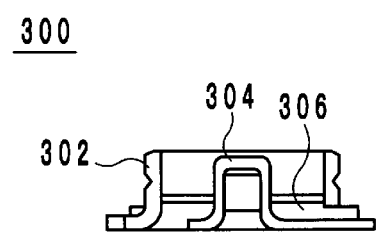
FIG. 4 is a cross-sectional view of a connector connected to a probe according to an embodiment.

(Overview of Counterpart Terminal—FIG. 4)

Terminals on the circuit board that are connected when the probe 1 measures an electrical signal will be described next.

The terminals on the circuit board will be referred to as "connectors 300" hereinafter. The connectors 300 are, for example, coaxial connectors provided between an antenna and an RF circuit in a cellular phone. As illustrated in FIG. 4, each connector 300 includes an outer conductor 302, a contact part 304, and a case 306.

The outer conductor 302 is a substantially cylindrical metal member. However, the cylinder formed by the outer conductor 302 is partially cut out. The potential of the outer conductor 302 is kept at a ground potential.

The contact part 304 is a metal terminal electrically connected to an RF circuit on the circuit board. As such, one end of the contact part 304 is a part against which the central conductor 20 of the probe 1 is pressed when measuring an electrical signal from the RF circuit. The one end of the contact part 304 is located in the center of the cylinder formed by the outer conductor 302, and that one end has a bowl shape whose base portion faces the positive side in the z-axis direction. The base portion is a part that makes contact with the central conductor 20 of the probe 1, and thus has a flat surface. The contact part 304 passes from the center of the cylinder formed by the outer conductor 302, through the part of the cylinder that is cut out, and is connected to a transmission line extending to the RF circuit on the circuit board.

The case 306 is a member, made of resin, that is embedded between the outer conductor 302 and the contact part 304. This insulates the outer conductor 302 from the contact part 304.

(Measurement Operations Using Probe—FIGS. 5 to 9)

Figure 5:
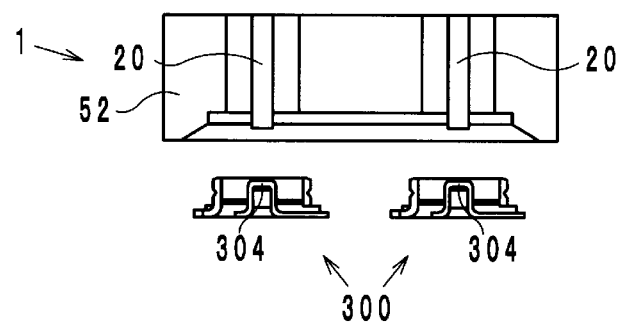
FIG. 5 is a diagram illustrating a process of connecting a probe and a connector according to an embodiment.
Figure 6:
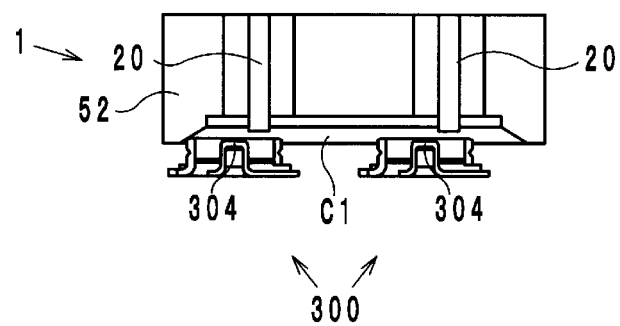
FIG. 6 is a diagram illustrating a process of connecting a probe and a connector according to an embodiment.

As described above, the probe 1 is a probe capable of simultaneously measuring electrical signals emitted from two terminals provided on a circuit board. Specifically, as illustrated in FIG. 5, the probe 1 is pressed against two connectors 300 (terminals) provided on the circuit board so as to cover those connectors 300. However, tolerances with regard to the positions of the connectors 300 on the circuit board mean that the central conductors 20 and the two contact parts 304 will not make satisfactory contact as-is. However, the recess portion C1, which has the sloped surface S1 that flares outward from the positive side toward the negative side in the z-axis direction, is provided in the tip end portion 52 of the probe 1. Thus when the probe 1 is pressed against the circuit board, the connectors 300 slide along the sloped surface S1 provided in the recess portion C1 and move toward the central conductors 20, as illustrated in FIG. 6.

Figure 7:
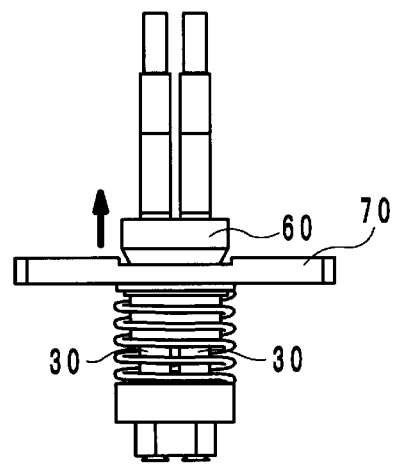
FIG. 7 is an external view illustrating a state of a second member when a probe is pressed against a circuit board according to an embodiment.
Figure 8:
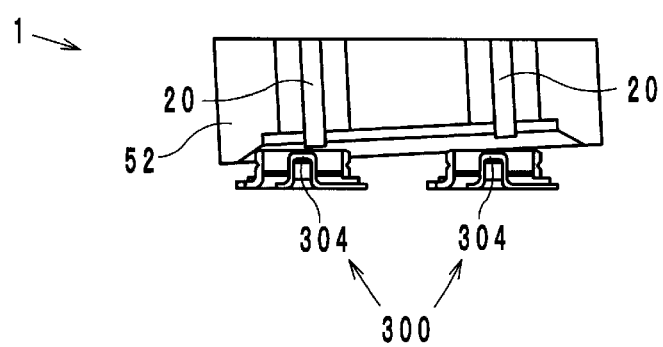
FIG. 8 is a diagram illustrating a process of connecting a probe and a connector according to an embodiment.
Figure 9:
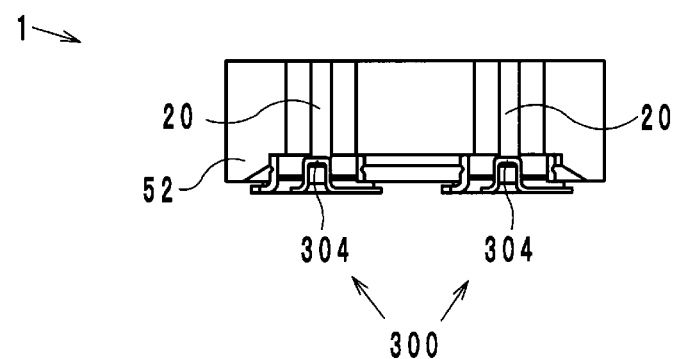
FIG. 9 is a diagram illustrating a process of connecting a probe and a connector according to an embodiment.

Furthermore, when the probe 1 is pressed against the circuit board, the first member 50 is pushed upward toward the positive side in the z-axis direction by an opposing force from the circuit board. This in turn pushes the second member 60, which binds together the two main body portions 30, upward toward the positive side in the z-axis direction, as illustrated in FIG. 7. As a result, the second member 60 is released from the flange 70. Additionally, as described above, there is a slight gap at the areas where the main body portions 30 make contact with the flange 70, and thus the main body portions 30 can tilt relative to the flange 70. For these reasons, when the probe 1 is pressed against the circuit board, the tip end portion 52 of the probe 1 can tilt freely so as to conform to the positions, shapes, and so on of the connectors 300, as illustrated in FIG. 8. Thus the central conductors 20 of the probe 1 can make surface contact with the contact parts 304 of the connectors 300, as illustrated in FIG. 9.

Effects

According to the probe 1, the main body portions 30 including the two central conductors 20 that make contact with the connectors 300 are bound together by the first member 50. Thus a situation in which probes make contact with each other can be avoided when measuring connectors 300 disposed near each other on a circuit board. In other words, if the probe 1 is used, the connectors 300 can be disposed near each other without causing any problems. This makes it possible to increase the density of connectors and the like on the circuit board.

Additionally, the recess portion C1, in which the tip ends of the two central conductors 20 project from a base surface, is provided in the first member 50, and the recess portion C1 has the sloped surface S1 that flares out from the base portion toward the opening thereof. Thus when the probe 1 is pressed against the connectors 300, the connectors 300 move along the sloped surface S1 and make contact with the central conductors 20. In other words, according to the probe 1, the sloped surface S1 in the recess portion C1 makes it possible for the contact parts 304 of the connectors 300 to make contact with the central conductors 20 in a smooth manner. Thus according to the probe 1, electrical signals emitted from the RF circuits can be accurately measured through the connectors 300.

Figure 10:
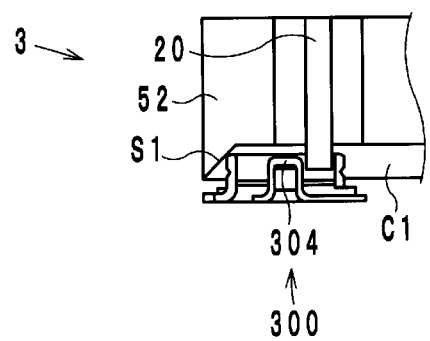
FIG. 10 is a cross-sectional view illustrating the vicinity of a central conductor in an enlarged manner, in a process of connecting a probe and a connector according to another embodiment.
Figure 11:
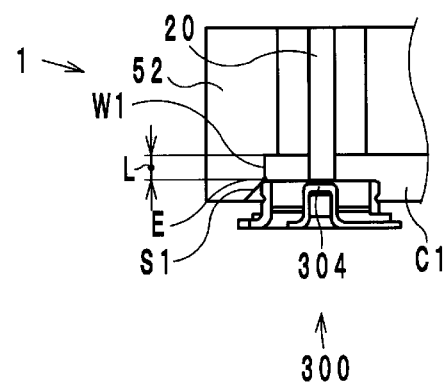
FIG. 11 is a cross-sectional view illustrating the vicinity of a central conductor in an enlarged manner, in a process of connecting a probe and a connector according to an embodiment.

Furthermore, the sloped surface S1 in the recess portion C1 is provided in a location distanced from the base portion of the recess portion C1 by the predetermined distance L in the z-axis direction. This makes it possible for the contact parts 304 of the connectors 300 to make contact with the central conductors 20 in an even smoother manner. Specifically, assume that the sloped surface S1 in the recess portion C1 is provided from the base portion of the recess portion C1. Here, when the connector 300 slides along the sloped surface S1, there is a risk that the outer conductor 302 will make contact with the central conductor 20 before the contact part 304. Meanwhile, when using a probe 3 according to another embodiment illustrated in FIG. 10, in which the predetermined distance L is 0, the connectors 300 being disposed near each other does not pose a problem, but there is a risk that the central conductor 20 of the probe 3 will become caught between the outer conductor 302 and the contact part 304 of the connector 300. On the other hand, in the probe 1 illustrated in FIG. 11, the sloped surface S1 in the recess portion C1 is provided in a location distanced from the base portion of the recess portion C1 by the predetermined distance L in the z-axis direction. More specifically, a wall surface W1 having a height L in a direction orthogonal to the base surface of the recess portion C1 is provided. The sloped surface S1 is provided from the wall surface W1. Thus as illustrated in FIG. 11, the connector 300 that has slid along the sloped surface S1 can reach an endpoint E, which is the closest part of the sloped surface S1 to the base portion of the recess portion C1, before the contact part 304 and the central conductor 20 make contact. As a result, the position of the contact part 304 of the connector 300 that has slid along the sloped surface S1 substantially matches the position of the central conductor 20, and in this state, the connector 300 is pressed into the base portion of the recess portion C1 along the wall surface W1. Thus compared to the configuration of the probe illustrated in FIG. 10, the configuration of the probe 1 illustrated in FIG. 11 provides a further effect of preventing a situation in which the outer conductors 302 come into contact with the central conductors 20 before the contact parts 304, a situation in which the central conductors 20 become caught between the outer conductors 302 and the contact parts 304 of the connectors 300, and so on, and is therefore desirable.

Incidentally, there is a small gap at the areas where the main body portions 30 make contact with the flange 70 in the probe 1. Thus the main body portions 30 can tilt relative to the flange 70. When the probe 1 is pressed against the circuit board, the tip end portion 52 of the probe 1 can tilt freely so as to conform to the positions, shapes, and so on of the connectors 300. Thus the central conductors 20 of the probe 1 can make surface contact with the contact parts 304 of the connectors 300.

In the probe 1, the two main body portions 30 are bound together not only by the first member 50 but also by the second member 60. Thus the two main body portions 30 are supported at two points, which stabilizes the attitudes thereof more than in the case where the main body portions 30 are supported only by the first member 50, for example. As a result, a situation in which the two main body portions 30 make contact with each other during measurement, and so on, can be prevented.

Furthermore, in the probe 1, the spring 80 and the main body portions 30 are not in contact, and are instead distanced from each other by the predetermined distance. Thus in the case where the pitch of the two central conductors 20 is changed, according to the probe 1, it is only necessary to change the pitch of the depressions H1 and H2 provided in the first member and the through-holes H5 and 6 provided in the second member. In other words, according to the probe 1, the pitch of the two central conductors 20 can be changed through an extremely easy method.

Other Embodiments

The probe according to the present disclosure is not intended to be limited to the aforementioned embodiment, and many variations can be made thereon without departing from the essential scope of the present disclosure. For examples, the materials, sizes, specific shapes, and so on of the respective members can be changed as desired. The number of central conductors is not limited to two, and may be three or more. Furthermore, the measurement subject for the probe according to the present disclosure is not limited to an RF circuit, and may be any component that emits an electrical signal.

INDUSTRIAL APPLICABILITY

The present disclosure as described above is useful in probes, and is particularly useful from the standpoint of enabling electronic components serving as measurement subjects to be disposed on a circuit board at a high density.

The invention claimed is:

1. A probe capable of simultaneously measuring a plurality of locations, the probe comprising:
   a plurality of main body portions, each of the plurality of main body portions including a central conductor, the plurality of central conductors being capable of individual and simultaneous contact with respective measurement subjects at the plurality of locations; and
   a first member that binds the plurality of main body portions together,
   wherein the first member has a recess portion, having a base surface from which tip ends of the plurality of central conductors project; and
   the recess portion has a sloped surface that flares outward from a base portion of the recess portion toward an opening in the recess portion.

2. The probe according to claim 1,
   wherein the sloped surface is provided in a location distanced from the base portion of the recess portion by a predetermined distance, in a height direction from the base portion of the recess portion toward the opening.

3. The probe according to claim 1, further comprising:
   a flange portion for attaching the main body portions to an anchoring tool,
   wherein a predetermined gap is provided at an area where the main body portions and the flange portion make contact.

4. The probe according to claim 1, further comprising:
   a spring that surrounds the main body portions,
   wherein the main body portions and the spring are distanced from each other by a predetermined distance.

5. The probe according to claim 1, further comprising:
   a second member that binds the plurality of main body portions together.

\* \* \* \* \*